US005547703A

United States Patent [19]

Camilletti et al.

[11] Patent Number: 5,547,703
[45] Date of Patent: Aug. 20, 1996

[54] METHOD OF FORMING SI-O CONTAINING COATINGS

[75] Inventors: Robert C. Camilletti, Midland; Fredric C. Dall, Merrill; Diana K. Dunn, Midland, all of Mich.

[73] Assignee: Dow Corning Corporation, Midland, Mich.

[21] Appl. No.: 225,688

[22] Filed: Apr. 11, 1994

[51] Int. Cl.[6] ........................................ B05P 5/12
[52] U.S. Cl. .................. 427/126.3; 427/227; 427/376.2; 427/377; 427/387
[58] Field of Search ............................. 427/126.3, 227, 427/376.2, 377, 387

[56] References Cited

U.S. PATENT DOCUMENTS 4,847,162  7/1989  Haluska et al. ........................... 428/457

Primary Examiner—Benjamin Utech
Attorney, Agent, or Firm—Roger E. Gobrogge

[57] ABSTRACT

Disclosed is a method for forming improved Si-O containing coatings on electronic substrates. The method comprises heating a hydrogen silsesquioxane resin successively under wet ammonia, dry ammonia and oxygen. The resultant coatings have improved properties such as low dielectric constants.

10 Claims, No Drawings

5,547,703

METHOD OF FORMING SI-O CONTAINING COATINGS

BACKGROUND

The present invention relates to a method of forming Si-O containing coatings. The method comprises exposing Si-O containing ceramic coatings obtained by the low temperature processing of hydrogen silsesquioxane resin to an annealing atmosphere containing oxygen. The resultant coatings have desirable properties.

The use of silica-containing ceramic coatings derived from hydrogen silsesquioxane resin on electronic devices is known in the art. For instance, Haluska et al. in U.S. Pat. No. 4,756,977 describe processes for forming coatings on electronic devices which comprise diluting hydrogen silsesquioxane in solvents, applying the solutions to substrates, evaporating the solvents and heating the coated substrates to a temperature of about 150° to about 1000° C. in an oxygen-containing environment such as air. This reference, however, does not describe the conversion and anneal process described herein.

It is also known in the art that hydrogen silsesquioxane resin can be converted to a Si-O containing ceramic in atmospheres of anhydrous ("dry") ammonia or ammonia and moisture. For instance, U.S. Pat. Nos. 4,847,162 and 5,262,201 teach the conversion of hydrogen silsesquioxane resin to Si-O containing ceramics by heating substrates coated with the resin in atmospheres of anhydrous ammonia and ammonia/moisture respectively. These patents too, however, do not describe the annealing process of the present invention.

The problem to be solved by the present invention is that the above references not teach methods of forming coatings with improved electrical properties. The present inventors have now discovered that when Si-O containing coatings derived from the conversion of hydrogen silsesquioxane resin in wet/dry ammonia are annealed in an atmosphere containing oxygen, the electrical properties of the coating are improved.

SUMMARY OF THE INVENTION

The present invention relates to a method of forming an Si-O containing coating on an electronic substrate. The method comprises first applying a coating comprising hydrogen silsesquioxane resin on an electronic substrate. The coated electronic substrate is heated in an atmosphere containing ammonia and moisture and then in an atmosphere containing substantially anhydrous ammonia at a temperature sufficient to convert the hydrogen silsesquioxane resin to an Si-O containing ceramic coating. The Si-O containing ceramic coating is then exposed to an atmosphere containing oxygen for a time and at a temperature sufficient to anneal the coating.

DETAILED DESCRIPTION OF THE INVENTION

The present invention is based on the unexpected discovery that the conversion and annealing process for hydrogen silsesquioxane resin described herein improves the properties of the coatings. For instance, this conversion and anneal can lower the dielectric constant of the coating, render the dielectric constant of the coating more consistent, and improve the loss factor and the volume resistivity. These effects were particularly unexpected since conversion and/or heating of hydrogen silsesquioxane resin under any one of these conditions fails to reproduce the results.

Because of these effects, the coatings resulting from this invention are particularly valuable on electronic substrates. Such coatings could serve, for example, as protective coatings, interlevel dielectric layers, doped dielectric layers to produce transistor like devices, pigment loaded binder systems containing silicon to produce capacitor and capacitor like devices, multilayer devices, 3-D devices, silicon on insulator devices, coatings for superconductors, super lattice devices and the like.

As used in the present invention, the expression "ceramic" is used to describe the hard, Si-O containing coatings obtained after heating hydrogen silsesquioxane resin. These coatings may contain both silica ($SiO_2$) materials as well as silica-like materials (eg., SiO, $Si_2O_3$, etc.) which are not fully free of residual carbon, silanol (Si-OH) and/or hydrogen. The coatings may also be doped with boron or phosphorous. The expression "anneal" is used to describe the heat treatment in oxygen described herein. The expression "electronic substrate" is meant to include, but is not limited to, electronic devices or electronic circuits such as silicon based devices, gallium arsenide based devices, focal plane arrays, opto-electronic devices, photovoltaic cells and optical devices.

According to the process of the invention, a coating comprising hydrogen silsesquioxane resin is first applied on an electronic substrate. The hydrogen silsesquioxane resins (H-resin) which may be used in this process include hydridosiloxane resins of the formula $HSi(OH)_x(OR)_yO_{z/2}$, in which each R is independently an organic group or a substituted organic group which, when bonded to silicon through the oxygen atom, forms a hydrolyzable substituent, $x=0-2$, $y=0-2$, $z=1-3$, $x+y+z=3$. Examples of R include alkyls such as methyl, ethyl, propyl, butyl, etc., aryls such as phenyl, and alkenyls such as allyl or vinyl. These resins may be fully condensed $(HSiO_{3/2})_n$ or they may be only partially hydrolyzed (i.e., containing some Si-OR) and/or partially condensed (i.e., containing some Si-OH). Although not represented by this structure, these resins may also contain a small number (e.g., less than about 10%) of silicon atoms which have either 0 or 2 hydrogen atoms attached thereto or a small number of SiC bonds due to various factors involved in their formation or handling. Additionally, the resin may also be doped with boron or phosphorous if desired.

The above H-resins and methods for their production are known in the art. For example, Collins et al. in U.S. Pat. No. 3,615,272, which is incorporated herein by reference, teach the production of a nearly fully condensed H-resin (which may contain up to 100–300 ppm silanol) by a process comprising hydrolyzing trichlorosilane in a benzenesulfonic acid hydrate hydrolysis medium and then washing the resultant resin with water or aqueous sulfuric acid. Similarly, Bank et al. in U.S. Pat. No. 5,010,159, which is hereby incorporated by reference, teach an alternative method comprising hydrolyzing hydridosilanes in an arylsulfonic acid hydrate hydrolysis medium to form a resin which is then contacted with a neutralizing agent.

Other hydridosiloxane resins, such as those described by Frye et al. in U.S. Pat. No. 4,999,397, hereby incorporated by reference, those produced by hydrolyzing an alkoxy or acyloxy silane in an acidic, alcoholic hydrolysis medium, those described in Kokai Patent Nos. 59-178749, 60-86017 and 63-107122, or any other equivalent hydridosiloxane, will also function herein.

It is to be noted that in a preferred embodiment of the invention, specific molecular weight fractions of the above H-resins may also be used in this process. Such fractions and methods for their preparation are taught by Hanneman et al. in U.S. Pat. No. 5,063,267 which is hereby incorporated by reference. A preferred fraction comprises material wherein at least 75% of the polymeric species have a molecular weight above about 1200 and a more preferred fraction comprises material wherein at least 75% of the polymeric species have a molecular weight between about 1200 and about 100,000.

The hydrogen silsesquioxane resin coating material may also contain other ceramic oxide precursors. Examples of such ceramic oxide precursors include compounds of various metals such as aluminum, titanium, zirconium, tantalum, niobium and/or vanadium as well as various nonmetallic compounds such as those of boron or phosphorous which may be dissolved in solution, hydrolyzed, and subsequently pyrolyzed, at relatively low temperatures and relatively rapid reaction rates to form ceramic oxide coatings.

The above ceramic oxide precursor compounds generally have one or more hydrolyzable groups bonded to the above metal or non-metal, depending on the valence of the metal. The number of hydrolyzable groups to be included in these compounds is not critical as long as the compound is soluble in the solvent. Likewise, selection of the exact hydrolyzable substituent is not critical since the substituents are either hydrolyzed or pyrolyzed out of the system. Typical hydrolyzable groups include, but are not limited to, alkoxy, such as methoxy, propoxy, butoxy and hexoxy, acyloxy, such as acetoxy, or other organic groups bonded to said metal or non-metal through an oxygen such as acetylacetonate. Specific compounds, therefore, include zirconium tetracetylacetonate, titanium dibutoxy diacetylacetonate, aluminum triacetylacetonate, tetraisobutoxy titanium, $B_3(OCH_3)_3O_3$ and $P_3(OCH_2CH_3)_3O$.

When hydrogen silsesquioxane resin is to be combined with one of the above ceramic oxide precursors, generally it is used in an amount such that the final ceramic coating contains 70 to 99.9 percent by weight $SiO_2$.

The hydrogen silsesquioxane resin coating material may also contain a platinum, rhodium or copper catalyst to increase the rate and extent of conversion to silica. Generally, any platinum, rhodium or copper compound or complex which can be solubilized will be functional. For instance, a composition such as platinum acetylacetonate, rhodium catalyst $RhCl_3[S(CH_2CH_2CH_2CH_3)_2]_3$, obtained from Dow Corning Corporation, Midland, Mich., or cupric naphthenate are all within the scope of this invention. These catalysts are generally added in an amount of between about 5 to 1000 ppm platinum, rhodium or copper based on the weight of hydrogen silsesquioxane resin.

The H-resin is coated on the desired substrate by any practical means but a preferred approach uses a solution comprising the H-resin in a suitable solvent. If this solution approach is used, the solution is generally formed by simply dissolving or suspending the H-resin in a solvent or mixture of solvents. Various facilitating measures such as stirring and/or heat may be used to assist in the dissolution. The solvents which may be used in this method include, for example, alcohols such as ethyl or isopropyl, aromatic hydrocarbons such as benzene or toluene, aliphatic hydrocarbons such as n-heptane or dodecane, ketones, linear or cyclic polysiloxanes, esters or ethers, in an amount sufficient to dissolve the above materials to low solids. For instance, enough of the above solvent can be included to form a 0.1–50 weight percent solution.

The above H-resin solution is then applied to the substrate. Means such as spin, spray, dip or flow coating will all function herein. Following application, the solvent is allowed to evaporate by means such as simple air drying by exposure to an ambient environment or by the application of a vacuum or mild heat.

Although the above described methods primarily focus on using a solution approach, one skilled in the art would recognize that other equivalent means of coating (e.g., melt coating) would also function herein and are contemplated to be within the scope of this invention.

The coated electronic substrate is then heated to a temperature sufficient to convert the hydrogen silsesquioxane resin to an Si-O containing ceramic coating. In the first step of the heating process, the H-resin is heated under an environment which contains both ammonia and moisture ("wet ammonia"). Such a process is described in U.S. Pat. No. 5,262,201, which is incorporated herein by reference. Generally, this process merely comprises heating the coated substrate to a temperature in the range of about 75° to about 400° C. in an environment which contains both moisture and ammonia. Such an environment can be produced, for example, by bubbling ammonia through water, by introducing both moisture and ammonia into the environment or by heating ammonium hydroxide. Preferred temperatures are in the range of about 150° to about 300° C. Generally, the heating time under the ammonia/moisture environment is at least about 15 minutes with times in the range of 30 minutes to 6 hours being preferred. During this process, the hydrogen silsesquioxane resin is hydrolyzed and partially cured.

In the second step of the process, the H-resin is heated under an environment which comprises substantially anhydrous ammonia ("dry ammonia"). As used herein, "substantially anhydrous ammonia" is used to describe an environment which preferably contains 100% ammonia, but which can tolerate small amounts (e.g., <1%) of other impurities. Such a process is described in U.S. Pat. No. 4,847,162, which is incorporated herein by reference. Generally, this process merely comprises heating the coated substrate to a temperature in the range of about 75° to about 400° C. in an environment which contains substantially anhydrous ammonia. Preferred temperatures are in the range of about 150° to about 300° C. Generally, the heating time under substantially anhydrous ammonia is at least about 15 minutes with times in the range of 30 minutes to 6 hours being preferred. During this step, the silanol content of the coating is reduced and an Si-O containing ceramic coating results.

Generally, these first 2 heating steps are conducted by placing the coated substrate in a heating device, initiating heating, introducing the wet ammonia atmosphere into the heating device, discontinuing the wet ammonia and then introducing the dry ammonia atmosphere into the heating device.

The resultant Si-O containing ceramic coating is then heated under an atmosphere containing oxygen for a time and at a temperature sufficient to anneal the coating. Although not wishing to be bound by theory, Applicants postulate that the oxygen anneal removes water and silanol (Si-OH) from the coatings and thereby improves its electrical properties. As such, the anneal temperature/time should be such that the water and/or silanol is removed.

The oxygen anneal can occur immediately after formation of the Si-O containing ceramic coating or, alternatively, the anneal can be at any later time. Generally, this anneal is accomplished by introducing an oxygen containing atmosphere into a heating chamber or furnace used for the anneal.

The oxygen used herein can be in any concentration practical. For example, concentrations in the range of between about 0.01 and 100 volume percent can be used. Generally, preferred concentrations are in the range of about 1 to about 30 volume percent. For instance, heating in air is an effective method which may be used herein.

The diluent gas for the oxygen is likewise not critical. Inert gases such a nitrogen, argon, helium, etc. or reactive gases such as air may all be used.

The temperature used during the oxygen anneal can also vary over a wide range. Temperatures of from about 150° up to about 600° C. are all functional herein. Preferred temperatures are generally in the range of between about 300° and about 500° C., with temperatures of about 400° C. being most preferred.

The time used for the oxygen anneal can also vary over a wide range. Generally, anneal times in excess of 30 minutes are functional herein and can continue as long as desired (eg. days). Preferred anneal times are in the range of between about 1 to 72 hours.

During each of the above heating steps, nearly any heating instrument can be used such as a convection oven, rapid thermal processing, hot plate, or radiant or microwave energy. The rate of heating, moreover, is also not critical, but it is most practical and preferred to heat as rapidly as possible. Finally, the above heating and anneal can be performed under any pressure desired from below atmospheric to above atmospheric.

The resultant coatings have desirable electrical characteristics compared coatings formed by other methods. For instance, the dielectric constant (DK) of the coating can be lowered to less than 2.5 at 1 MHz and this DK is more stable over the 100 Hz to 1 MHz range. Similarly, the loss factor of these coatings can be improved by 70% and the volume resistivity can be improved by 7 orders of magnitude. As such, it is evident that the coatings herein are useful on electronic devices.

The following non-limiting examples are included so that one skilled in the art may more readily understand the invention.

EXAMPLE 1

Hydrogen silsesquioxane resin (made by the method of Collins et al. in U.S. Pat. No. 3,615,272) was diluted to the concentration listed in Table in the solvents listed in Table 1. Six 100 mm silicon wafers were coated with these solutions by spinning at 3000 RPM for 20 seconds.

Two of the H-resin coated wafers were converted and annealed by the process of the present invention (Examples 2 and 4) as follows: 2 wafers were heated in a tube furnace for 2.5 hours at 250° C. under an atmosphere containing ammonia and water (steam and ammonia injected into the furnace) and then for 1 hour at 250° C. in an anhydrous ammonia atmosphere (ammonia only injected into the furnace). The resultant ceramic Si-O containing coatings were cooled to room temperature. The coatings were then heated at 400° C. for 72 hours in air. The electrical characteristics of the resultant coatings are set forth in Table 1.

Two of the H-resin coated wafers were converted to an Si-O containing ceramic under wet and dry ammonia (no anneal) (1 and 3) as follows: 2 wafers were heated in a tube furnace for 2.5 hours at 250° C. under an atmosphere containing ammonia and water (steam and ammonia injected into the furnace) and then for 1 hour at 250° C. in an anhydrous ammonia atmosphere (ammonia only injected into the furnace). The resultant ceramic Si-O containing coatings were cooled to room temperature. The electrical characteristics of the resultant coatings are set forth in Table 1.

Two of the H-resin coated wafers were cured at 400° C. in air to form an Si-O containing ceramic (no wet and dry ammonia) (5 and 6) as follows: 2 wafers were heated in a tube furnace for 72 hours at 400° C. in air. The resultant ceramic Si-O containing coatings were cooled to room temperature. The electrical characteristics of the resultant coatings are set forth in Table 1.

As is evident, the combination of a low temperature wet and dry ammonia conversion followed by an air anneal has a dramatic effect on their electrical properties.

TABLE 1

Characteristics of Coatings

| Ex No | Conc (solv) | Dielectric Constant | Loss Factor | Resistivity (Ohm-cm) |
|---|---|---|---|---|
| 1 | 18% (CDMS*) | 100 Hz - 5.66<br>1 KHz - 4.28<br>10 KHz - 3.71<br>100 KHz - 3.13<br>1 MHz - 2.56 | 100 Hz - 0.085<br>1 KHz - 0.097<br>10 KHz - 0.074<br>100 KHz - 0.149<br>1 MHz - 0.227 | 4.53 E + 07 |
| 2 | 18% (CDMS*) | 100 Hz - 3.38<br>1 KHz - 3.21<br>10 KHz - 2.97<br>100 KHz - 2.68<br>1 MHz - 2.42 | 100 Hz - 0.024<br>1 KHz - 0.024<br>10 KHz - 0.038<br>100 KHz - 0.053<br>1 MHz - 0.061 | 4.27 E + 15 |
| 3 | 25% (MIBK#) | 100 Hz - 6.04<br>1 KHz - 4.67<br>10 KHz - 3.97<br>100 KHz - 3.57<br>1 MHz - 2.84 | 100 Hz - 0.212<br>1 KHz - 0.133<br>10 KHz - 0.070<br>100 KHz - 0.010<br>1 MHz - 0.149 | 7.85 E + 07 |
| 4 | 25% (MIBK#) | 100 Hz - 3.98<br>1 KHz - 3.85<br>10 KHz - 3.96<br>100 KHz - 3.88<br>1 MHz - 3.71 | 100 Hz - 0.006<br>1 KHz - 0.006<br>10 KHz - 0.007<br>100 KHz - 0.028<br>1 MHz - 0.035 | 7.83 E + 15 |
| 5 | 22% (MIBK#) | 100 Hz - 4.29<br>1 KHz - 4.28<br>10 KHz - 4.27<br>100 KHz - 4.26<br>1 MHz - 4.24 | 100 Hz - 0.001<br>1 KHz - 0.001<br>10 KHz - 0.003<br>100 KHz - 0.004<br>1 MHz - 0.004 | 2.9 E + 15 |
| 6 | 18% (CDMS*) | 100 Hz - 5.14<br>1 KHz - 5.09<br>10 KHz - 5.06<br>100 KHz - 5.01<br>1 MHz - 4.92 | 100 Hz - 0.01<br>1 KHz - 0.005<br>10 KHz - 0.005<br>100 KHz - 0.008<br>1 MHz - 0.023 | 2.3 E + 13 |

*CDMS = cyclic dimethylpolysiloxane
MIBK = methyl isobutyl ketone

That which is claimed is:

1. A method of forming an Si-O containing coating on an electronic substrate comprising:

(a) applying a coating comprising hydrogen silsesquioxane resin on an electronic substrate;

(b) heating the coated substrate at a temperature between about 75° and about 400° C. in an atmosphere consisting essentially of ammonia and moisture for at least about 15 minutes;

(c) heating the coated substrate resulting from step (b) at a temperature between about 75° and about 400° C. in an atmosphere consisting essentially of substantially anhydrous ammonia for at least about 15 minutes; and (d) heating the coated substrate resulting from step (c) to a temperature of at least about 150° C. in an oxygen containing atmosphere for a time between 30 minutes and 72 hours to anneal the coating.

2. The method of claim 1 wherein the hydrogen silsesquioxane resin is applied to the substrate by a process which comprises coating the substrate with a solution comprising a solvent and the hydrogen silsesquioxane resin and then evaporating the solvent.

3. The method of claim 1 wherein at least 75% of the polymeric species of the hydrogen silsesquioxane resin have a molecular weight between about 1200 and about 100,000.

4. The method of claim 1 wherein the coating comprising hydrogen silsesquioxane resin also contains a modifying ceramic oxide precursor comprising a compound containing an element selected from the group consisting of titanium, zirconium, aluminum, tantalum, vanadium, niobium, boron and phosphorous wherein the compound contains at least one hydrolyzable substituent selected from the group consisting of alkoxy or acyloxy and the compound is present in an amount such that the coating contains 0.1 to 30 percent by weight modifying ceramic oxide.

5. The method of claim 1 wherein the coating comprising hydrogen silsesquioxane resin also contains a platinum, rhodium or copper catalyst in an amount of between about 5 and about 500 ppm platinum, rhodium or copper based on the weight of hydrogen silsesquioxane resin.

6. The method of claim 1 wherein the heating in step (b) is at a temperature of between 150° and 350° C. for between 30 minutes and 6 hours.

7. The method of claim 1 wherein the heating in step (c) is at a temperature of between 150° and 350° C. for between 30 minutes and 6 hours.

8. The method of claim 1 wherein the heating in step (d) is at a temperature of between 150° and 600° C. for at least 15 minutes.

9. The method of claim 1 wherein the oxygen containing atmosphere contains oxygen in a concentration in the range of about 1 to about 30 volume percent.

10. The method of claim 1 wherein the oxygen containing atmosphere comprises air.

* * * * *